US012787264B2

(12) United States Patent
Chiang

(10) Patent No.: US 12,787,264 B2
(45) Date of Patent: Nov. 3, 2026

(54) SEMICONDUCTOR STRUCTURE INCLUDING BURIED BIT LINE STRUCTURES HAVING DIFFERENT WIDTHS

(71) Applicant: NANYA TECHNOLOGY CORPORATION, New Taipei City (TW)

(72) Inventor: Hsu Chiang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 343 days.

(21) Appl. No.: 18/443,720

(22) Filed: Feb. 16, 2024

(65) Prior Publication Data

US 2025/0240944 A1 Jul. 24, 2025

Related U.S. Application Data

(62) Division of application No. 18/421,042, filed on Jan. 24, 2024.

(51) Int. Cl.
*H10B 12/00* (2023.01)

(52) U.S. Cl.
CPC ........... *H10B 12/482* (2023.02); *H10B 12/02* (2023.02)

(58) Field of Classification Search
CPC .............................. H10B 12/482; H10B 12/02
See application file for complete search history.

(56) References Cited

U.S. PATENT DOCUMENTS

| | | | | |
|---|---|---|---|---|
| 2007/0040200 | A1 | 2/2007 | Tran et al. | |
| 2009/0085083 | A1 * | 4/2009 | Shin | H10B 12/485 257/E29.345 |
| 2011/0101450 | A1 | 5/2011 | Kim | |
| 2022/0122989 | A1 | 4/2022 | Wu et al. | |
| 2023/0354586 | A1 | 11/2023 | Cui et al. | |

FOREIGN PATENT DOCUMENTS

| | | | |
|---|---|---|---|
| TW | 379384 | B | 1/2000 |
| TW | 200423297 | A | 11/2004 |
| TW | 201108399 | A | 3/2011 |
| TW | 201240069 | A | 10/2012 |
| TW | 201304072 | A | 1/2013 |

OTHER PUBLICATIONS

Office Action and and the search report mailed on Dec. 24, 2024 related to Taiwanese Application No. 113110457.
Office Action and and the search report mailed on Jan. 10, 2025 related to Taiwanese Application No. 113145012.
Office Action and and the search report mailed on Apr. 14, 2026 related to U.S. Appl. No. 18/421,042.

* cited by examiner

*Primary Examiner* — Lex H Malsawma
(74) *Attorney, Agent, or Firm* — Xuan Zhang

(57) ABSTRACT

A semiconductor structure and a method of manufacturing the same are provided. The semiconductor structure includes a base structure, a first bit line structure and a second bit line structure. The first bit line structure is buried in the base structure. The second bit line structure is buried in the base structure. A maximum width of the first bit line structure is less than a maximum width of the second bit line structure.

16 Claims, 18 Drawing Sheets

SEMICONDUCTOR STRUCTURE INCLUDING BURIED BIT LINE STRUCTURES HAVING DIFFERENT WIDTHS

CROSS-REFERENCE TO RELATED APPLICATION

This application is a divisional application of U.S. Non-Provisional application Ser. No. 18/421,042 filed Jan. 24, 2024, which is incorporated herein by reference in its entirety.

TECHNICAL FIELD

The present disclosure relates to a semiconductor structure and a method of manufacturing the same, and more particularly, to a semiconductor structure including bit line structure, and a method of manufacturing the same.

DISCUSSION OF THE BACKGROUND

Semiconductor structures are used in a variety of electronic applications, and the dimensions of semiconductor structures are continuously being scaled down to meet the current application requirements. However, a variety of issues arise during the scaling-down process and impact the final electrical characteristics, quality, cost and yield. Typical memory devices (such as dynamic random access memory (DRAM) devices) include signal lines, such as word lines and bit lines crossing the word lines. As DRAM devices are scaled down and the dimensions and/or pitches of the signal lines are getting smaller, the parasitic capacitance will be a critical concern.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a base structure, a first bit line structure and a second bit line structure. The first bit line structure is buried in the base structure. The second bit line structure is buried in the base structure. A maximum width of the first bit line structure is less than a maximum width of the second bit line structure.

Another aspect of the present disclosure provides a semiconductor structure. The semiconductor structure includes a base structure, a cell contact and a bit line structure. The base structure includes a base portion and a first active area in the base portion. The cell contact is disposed over the base structure and electrically connected to the first active area. The bit line structure is disposed in the base portion and under the cell contact. The bit line structure is electrically insulated from the first active area.

Another aspect of the present disclosure provides a method of manufacturing a semiconductor structure. The method includes: providing a base structure, wherein the base structure includes a base portion and a plurality of active areas in the base portion; forming a plurality of trenches extending in the base portion and the plurality of active areas; forming a plurality of bit line structures in the plurality of trenches; and forming a plurality of cell contacts on some of the plurality of active areas.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
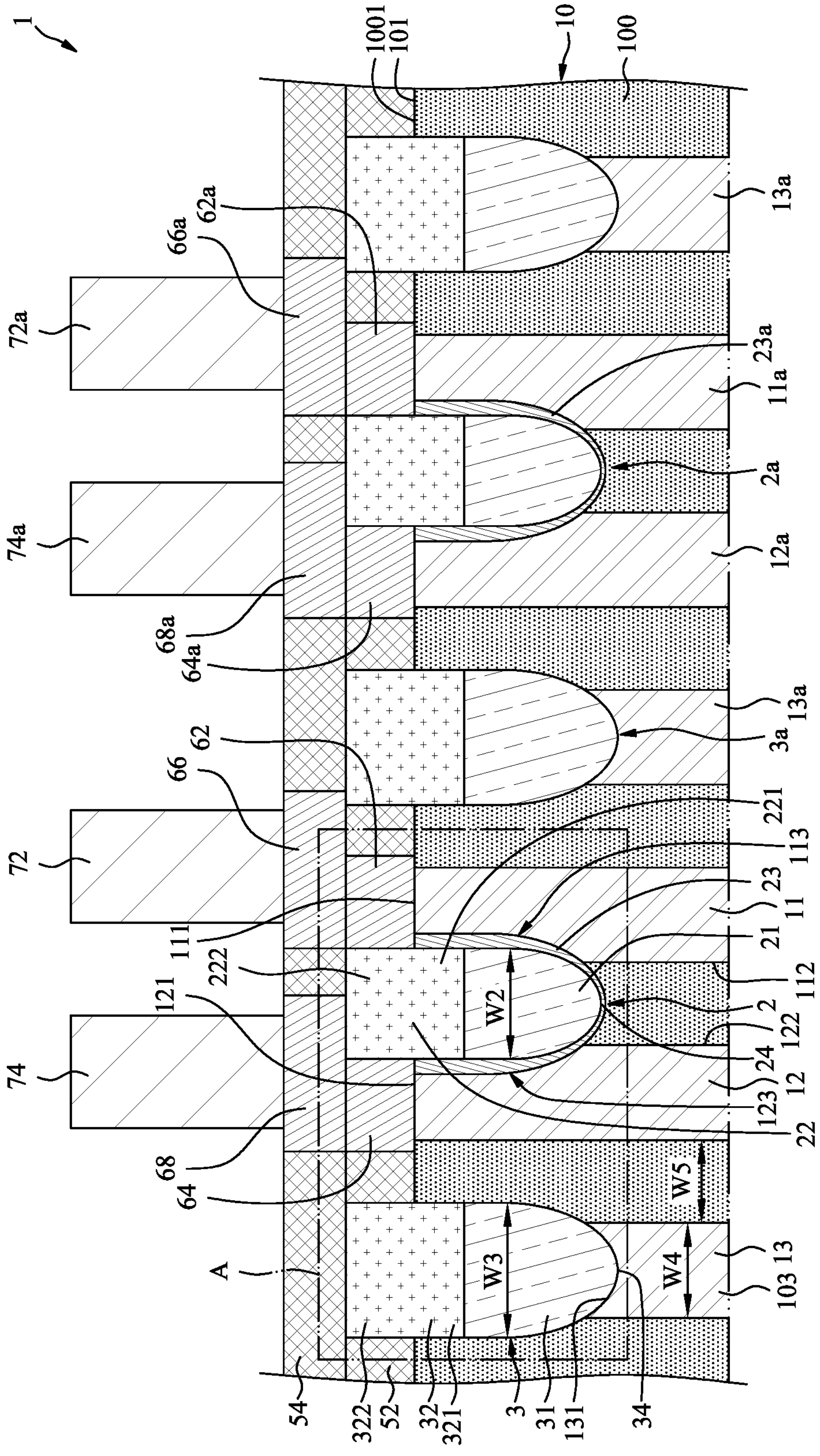
FIG. 1 illustrates a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
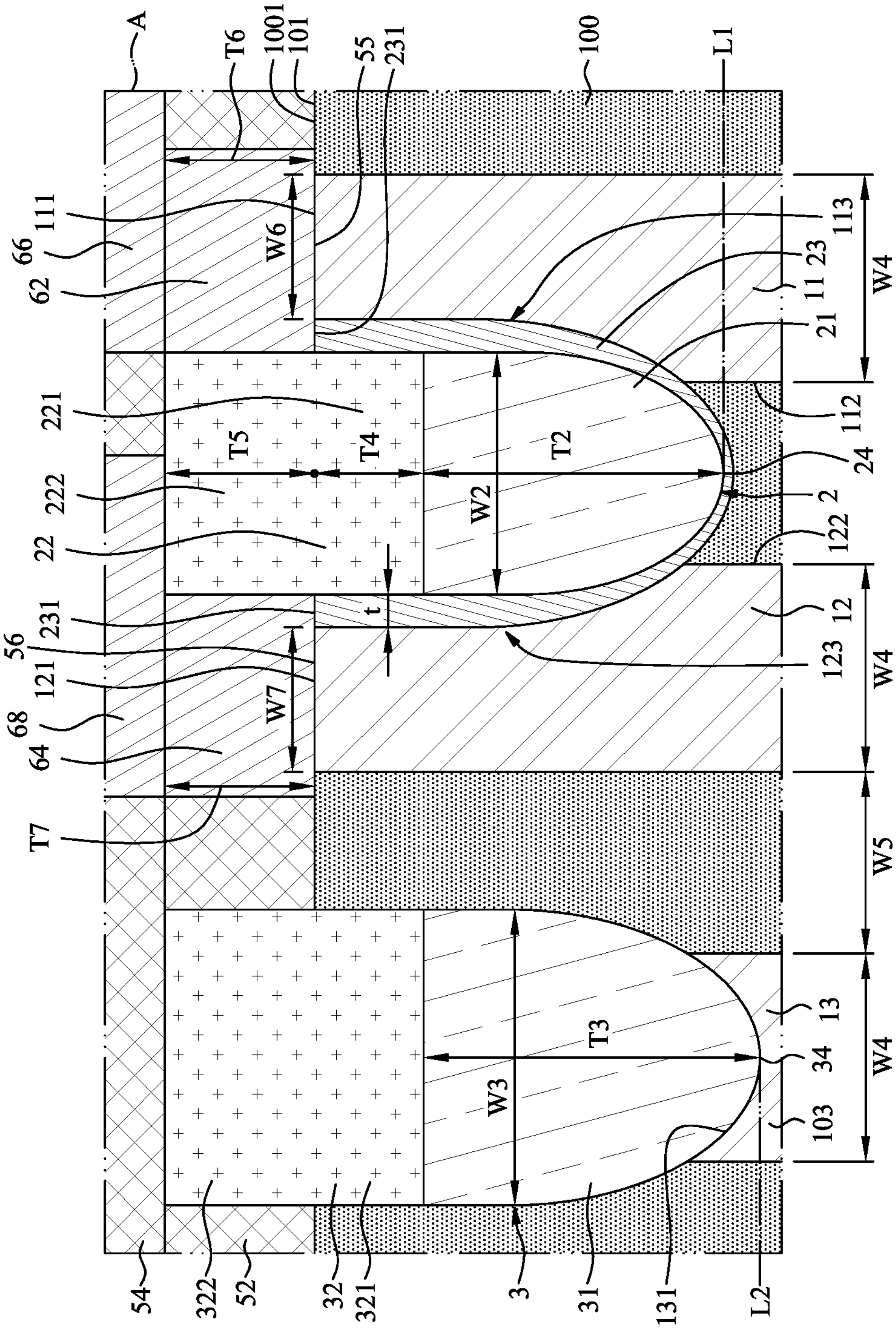
FIG. 2 illustrates an enlarged view of an area "A" of FIG. 1.

FIG. 1 illustrates a cross-sectional view of a semiconductor structure 1 in accordance with some embodiments of the present disclosure. FIG. 2 illustrates an enlarged view of an area "A" of FIG. 1. In some embodiments, the semiconductor structure 1 may be a semiconductor device that includes a circuit, such as a memory cell. In some embodiments, the memory cell may include a dynamic random access memory cell (DRAM cell).

In addition, the semiconductor structure 1 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

The semiconductor structure 1 may include a base structure 10, at least one bit line structure (e.g., a first bit line structure 2, a second bit line structure 3, a third bit line structure **2*a* and a fourth bit line structure 3*a*), at least one spacer 23, 23*a*, a first insulation layer 52, at least one cell contact (e.g., a first cell contact 62, a second cell contact 64, a third cell contact 62*a* and a fourth cell contact 64*a*), a second insulation layer 54, at least one landing pad (e.g., a first landing pad 66, a second landing pad 68, a third landing pad 66*a* and a fourth landing pad 68*a*) and at least one conductive structure (e.g., a first conductive structure 72, a second conductive structure 74, a third conductive structure 72*a* and a fourth conductive structure 74*a***).

The base structure 10 may be a substrate, and may include a dielectric material, such as an oxide material or a nitride material. Alternatively, the base structure 10 may be a substrate, and may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the base structure 10 may include a base portion 100 and a plurality of active areas 103 (e.g., a first active area 11, a second active area 12, a third active area 13, a fourth active area **11*a*, a fifth active area 12*a* and a sixth active area 13*a*) disposed in or embedded in the base portion 100**.

The base portion 100 may include dielectric oxide material, and may have a top surface 1001 (e.g., a first surface). Each of the active areas 103 (e.g., the first active area 11, the second active area 12, the third active area 13, the fourth active area **11*a*, the fifth active area 12*a* and the sixth active area 13*a*) may include silicon (Si) material, and may have a width W4. A portion of the base portion 100 that is disposed between the active areas 103 may have a width W5. The width W4 of the active area may be greater than or equal to the width W5 of the portion of the base portion 100 that is disposed between the active areas 103**.

In some embodiments, each of the third active area 13 and the sixth active area **13*a* may be a drain electrode. Each of the first active area 11, the second active area 12, the fourth active area 11*a* and the fifth active area 12*a*** may be a source electrode.

In some embodiments, as shown in FIG. 1, the base structure 10 may have a top surface 101 (e.g., a first surface). The active areas 103 (e.g., the first active area 11, the second active area 12, the fourth active area **11*a* and the fifth active area 12*a*) may be exposed from the top surface 101 (e.g., the first surface) of the base structure 10. In some embodiments, the first active area 11 may have a top surface 111 and a lateral surface 112. The top surface 111 of the first active area 11 may be aligned with or coplanar with the top surface 1001 of the base portion 100, and may be a portion of the top surface 101 of the base structure 10. The top surface 111 of the first active area 11 may be exposed from the top surface 101 of the base structure 10. In addition, the first active area 11 may define an indentation 113 at a corner. The indentation 113 may be recessed from the top surface 111 of the first active area 11 and the lateral surface 112 of the first active area 11. The indentation 113 may be configured to accommodate a portion of the first bit line structure 2 and a portion of the spacer 23. The indentation 113 may have a curved sidewall. The first active area 11** may be not a symmetrical structure.

In some embodiments, the second active area 12 may have a top surface 121 and a lateral surface 122. The lateral surface 122 of the second active area 12 may face the lateral surface 112 of the first active area 11. The top surface 121 of the second active area 12 may be aligned with or coplanar with the top surface 1001 of the base portion 100, and may be a portion of the top surface 101 of the base structure 10. The top surface 121 of the second active area 12 may be exposed from the top surface 101 of the base structure 10. In addition, the second active area 12 may define an indentation 123 at a corner. The indentation 123 may be recessed from the top surface 121 of the second active area 12 and the lateral surface 122 of the second active area 12. The indentation 123 of the second active area 12 may face the indentation 113 of the first active area 11. The indentation 123 may be configured to accommodate a portion of the first bit line structure 2 and a portion of the spacer 23. The indentation 123 may have a curved sidewall. The second active area 12 may be not a symmetrical structure.

In some embodiments, the third active area 13 may have a top surface 131. The top surface 131 may be concave, and may be configured to receive a portion of the second bit line structure 3. The third active area 13 may be a symmetrical structure. The third active area 13 may be spaced apart from the top surface 101 of the base structure 10. Thus, the top surfaces 111, 121, 131 of the active areas 103 (e.g., the first active area 11, the second active area 12 and the third active area 13) are not aligned with each other.

The at least one bit line structure may include a plurality of bit line structures (e.g., the first bit line structure 2, the second bit line structure 3, the third bit line structure 2*a* and the fourth bit line structure 3*a*), and may be buried or embedded in the base structure 10. The first bit line structure 2 may include a main portion 21 and a cap portion 22 disposed on the main portion 21. The main portion 21 may include a metal such as tungsten (W), and the cap portion 22 may include an insulation material such as silicon nitride (SiN). The main portion 21 may be also referred to as "a bit line structure" or "a bit line". The main portion 21 may be disposed under the top surface 101 (e.g., the first surface) of the base structure 10, and under the first cell contact 62 and the second cell contact 64. The cap portion 22 may extend through the top surface 101 (e.g., the first surface) of the base structure 10. The cap portion 22 may include a lower portion 221 and an upper portion 222. The cap portion 22 may be a monolithic structure. The lower portion 221 is lower than the top surface 101 of the base structure 10. That is, the lower portion 221 is located under the top surface 101 of the base structure 10. The upper portion 222 is higher than the top surface 101 of the base structure 10. That is, the upper portion 222 may protrude beyond the top surface 101 of the base structure 10.

The first bit line structure 2 may be disposed between the active areas 103, and may be electrically insulated with the active areas 103. For example, the first bit line structure 2 may be disposed between the first active area 11 and the second active area 12, and may be electrically insulated with the first active area 11 and the second active area 12. The first bit line structure 2 may laterally overlap the active areas 103 such as the first active area 11 and the second active area 12. The first bit line structure 2 may include a bottom end 24. The bottom end 24 may be a bottom end of the main portion 21.

The spacer 23 may be disposed around the first bit line structure 2. The spacer 23 may include an insulation material such as an oxide material. The spacer 23 may be disposed between the first bit line structure 2 and the first active area 11 so that the first bit line structure 2 may be electrically insulated with the first active area 11 by the spacer 23. The spacer 23 may be disposed between the first bit line structure 2 and the second active area 12 so that the first bit line structure 2 is electrically insulated with the second active area 12 by the spacer 23. The spacer 23 may have a top surface 231. The top surface 231 of the spacer 23 may be aligned with or coplanar with the top surface 101 of the base structure 10 (including the top surface 1001 of the base portion 100, the top surface 111 of the first active area 11 and the top surface 121 of the second active area 12).

In some embodiments, the first bit line structure 2 and the spacer 23 may be disposed in the indentation 113 of the first active area 11 and the indentation 123 of the second active area 12. Thus, the first bit line structure 2 and the spacer 23 may extend beyond the lateral surface 112 of the first active area 11 and the lateral surface 122 of the second active area 12.

The shapes of the indentation 113 of the first active area 11 and the indentation 123 of the second active area 12 may be conformal with the spacer 23. In some embodiments, the spacer 23 may have an inconsistent thickness t. The spacer 23 may taper toward the bottom end 24 of the first bit line structure 2. That is, the thickness t of the spacer 23 may gradually reduce toward the bottom end 24 of the first bit line structure 2.

The first bit line structure 2 may be a passing bit line structure. The first bit line structure 2 may have a maximum width W2, which may be equal to a maximum width of the main portion 21 and a maximum width of the cap portion 22. The maximum width W2 of the first bit line structure 2 may be greater than the width W4 of the first active area 11 and the width W5 of the portion of the base portion 100 that is disposed between the active areas 103. In addition, the main portion 21 may have a maximum thickness T2. The lower portion 221 of the cap portion 22 may have a thickness T4. For example, the thickness T4 may be in a range from 30 nm to 50 nm. The upper portion 222 of the cap portion 22 may have a thickness T5.

The second bit line structure 3 may include a main portion 31 and a cap portion 32 disposed on the main portion 31. The main portion 31 may include a metal such as tungsten (W), and the cap portion 32 may include an insulation material such as silicon nitride (SiN). The main portion 31 may be also referred to as "a bit line structure" or "a bit line". The main portion 31 may be disposed under the top surface 101 (e.g., the first surface) of the base structure 10, and under the first cell contact 62 and the second cell contact 64. The cap portion 32 may extend through the top surface 101 (e.g., the first surface) of the base structure 10. The cap portion 32 may include a lower portion 321 and an upper portion 322. The lower portion 321 is lower than the top surface 101 of the base structure 10. That is, the lower portion 321 is located under the top surface 101 of the base structure 10. The upper portion 322 is higher than the top surface 101 of the base structure 10. That is, the upper portion 322 may protrude beyond the top surface 101 of the base structure 10.

The second bit line structure 3 may be disposed over or disposed on the third active area 13, and may be electrically connected to the active areas 103 such as the third active area 13. For example, the main portion 31 of the second bit line structure 3 may directly contact the top surface 131 of the third active area 13. In addition, the second bit line structure 3 may laterally overlap the active areas 103 such as the first active area 11 and the second active area 12. The second bit line structure 3 may include a bottom end 34. The bottom end 34 may be a bottom end of the main portion 31.

The second bit line structure 3 may be free from being surrounded by a spacer. That is, there is no spacer disposed around the second bit line structure 3. There is no spacer disposed between the second bit line structure 3 and the third active area 13 so that the second bit line structure 3 may be electrically connected to the third active area 13. In some embodiments, the second bit line structure 3 may extend beyond two opposite lateral surfaces of the third active area 13. The shape of the top surface 131 of the third active area 13 may be conformal with the second bit line structure 3.

The second bit line structure 3 may be an active bit line structure. The second bit line structure 3 may have a maximum width W3, which may be equal to a maximum width of the main portion 31 and a maximum width of the cap portion 32. The maximum width W3 of the second bit line structure 3 may be greater than the width W4 of the third active area 13 and the width W5 of the portion of the base portion 100 that is disposed between the active areas 103. The maximum width W2 of the first bit line structure 2 is less than the maximum width W3 of the second bit line structure 3. In addition, the main portion 31 may have a maximum thickness T3. The maximum thickness T3 of the main portion 31 of the second bit line structure 3 may be greater than the maximum thickness T2 of the main portion 21 of the first bit line structure 2. The thickness of the cap portion 32 of the second bit line structure 3 may equal to the thickness of the cap portion 22 of the first bit line structure 2. In some embodiments, the bottom end 24 of the first bit line structure 2 may be not level with the bottom end 34 of the second bit line structure 3. For example, a level L1 (or an elevation) of the bottom end 24 of the first bit line structure 2 may be higher than a level L2 (or an elevation) of the bottom end 34 of the second bit line structure 3.

The first insulation layer 52 may be disposed on the top surface 101 of the base structure 10. A material of the first insulation layer 52 may be the same as or different from the material of the cap portion 22 of the first bit line structure 2 and the material of the cap portion 32 of the second bit line structure 3. For example, the first insulation layer 52 may include an insulation material such as silicon nitride (SiN), silicon oxynitride (SiON) or other suitable material. The cap portion 22 of the first bit line structure 2 and the cap portion 32 of the second bit line structure 3 may extend through the first insulation layer 52. Thus, the thickness of the first insulation layer 52 may be equal to the thickness T5 of the upper portion 222 of the cap portion 22 of the first bit line structure 2.

The first cell contact 62 may be disposed over the base structure 10 and may be electrically connected to the first active area 11. A material of the first cell contact 62 may include a conductive material such as titanium (Ti), tungsten (W) or other suitable material. The first cell contact 62 may cover and contact the first active area 11. Thus, a contact area 55 may be formed between the first cell contact 62 and the top surface 111 of the first active area 11. A width W6 of the contact area 55 may be greater than one half of the width W4 of the first active area 11. Further, the first cell contact 62 may cover and contact the top surface 231 of the spacer 23.

The first cell contact 62 may extend through the first insulation layer 52. Thus, the thickness T6 of the first cell contact 62 may be equal to the thickness of the first insulation layer 52 and the thickness T5 of the upper portion 222 of the cap portion 22 of the first bit line structure 2. A lateral surface of the first cell contact 62 may contact a lateral surface of the upper portion 222 of the cap portion 22 of the first bit line structure 2. In some embodiments, the main portion 21 of the first bit line structure 2 may be spaced apart from the first cell contact 62 by the lower portion 221 of the cap portion 22 of the first bit line structure 2 and a portion of the spacer 23.

The second cell contact 64 may be disposed over the base structure 10 and may be electrically connected to the second active area 12. A material of the second cell contact 64 may include a conductive material such as titanium (Ti), tungsten (W) or other suitable material. The second cell contact 64 may cover and contact the second active area 12. Thus, a contact area 56 may be formed between the second cell contact 64 and the top surface 121 of the second active area 12. A width W7 of the contact area 56 may be greater than one half of the width W4 of the second active area 12. Further, the second cell contact 64 may cover and contact the top surface 231 of the spacer 23.

The second cell contact 64 may extend through the first insulation layer 52. Thus, the thickness T7 of the second cell contact 64 may be equal to the thickness of the first insulation layer 52 and the thickness T5 of the upper portion 222 of the cap portion 22 of the first bit line structure 2. A lateral surface of the second cell contact 64 may contact a lateral surface of the upper portion 222 of the cap portion 22 of the first bit line structure 2. In some embodiments, the main portion 21 of the first bit line structure 2 may be spaced apart from the second cell contact 64 by the lower portion 221 of the cap portion 22 of the first bit line structure 2 and a portion of the spacer 23.

The second insulation layer 54 may be disposed on the first insulation layer 52. A material of the second insulation layer 54 may be the same as or different from the material of the first insulation layer 52. For example, the second insulation layer 54 may include an insulation material such as silicon nitride (SiN), silicon oxynitride (SiON) or other suitable material.

The first landing pad 66 may be disposed on the first insulation layer 52 and may be electrically connected to the first cell contact 62. A material of the first landing pad 66 may include a conductive material such as titanium (Ti), tungsten (W) or other suitable material. The first landing pad 66 may cover and contact the first cell contact 62. The first landing pad 66 may extend through the second insulation layer 54. Thus, the thickness of the first landing pad 66 may be equal to the thickness of the second insulation layer 54.

The second landing pad 68 may be disposed on the first insulation layer 52 and may be electrically connected to the second cell contact 64. A material of the second landing pad 68 may include a conductive material such as titanium (Ti), tungsten (W) or other suitable material. The second landing pad 68 may cover and contact the second cell contact 64 and the upper portion 222 of the cap portion 22 of the first bit line structure 2. The second landing pad 68 may extend through the second insulation layer 54. Thus, the thickness of the second landing pad 68 may be equal to the thickness of the second insulation layer 54.

The first conductive structure 72 may be disposed on and electrically connected to the first landing pad 66. The first conductive structure 72 may be a three-layered structure. The first conductive structure 72 may be a capacitance structure. In addition, the second conductive structure 74 may be disposed on and electrically connected to the second landing pad 68. The second conductive structure 74 may be a three-layered structure. The second conductive structure 74 may be a capacitance structure.

The third bit line structure 2*a* may be the same as or similar to the first bit line structure 2, and may be disposed between the fourth active area 11*a* and the fifth active area 12*a*. The spacer 23*a* may be the same as or similar to the spacer 23, and may be disposed around the third bit line structure 2*a*. The fourth bit line structure 3*a* may be the same as or similar to the second bit line structure 3, and may be disposed on the sixth active area 13*a*.

The third cell contact 62*a* may be the same as or similar to the first cell contact 62. The third cell contact 62*a* may be disposed over the base structure 10 and may cover and contact the fourth active area 11*a*. The third cell contact 62*a* may extend through the first insulation layer 52. In addition, the fourth cell contact 64*a* may be the same as or similar to the second cell contact 64. The fourth cell contact 64*a* may be disposed over the base structure 10 and may cover and contact the fifth active area 12*a*. The fourth cell contact 64*a* may extend through the first insulation layer 52.

The third landing pad 66*a* may be the same as or similar to the first landing pad 66. The third landing pad 66*a* may be disposed on the first insulation layer 52 and may cover and contact the third cell contact 62*a*. The third landing pad 66*a* may extend through the second insulation layer 54. In addition, the fourth landing pad 68*a* may be the same as or similar to the second landing pad 68. The fourth landing pad 68*a* may be disposed on the first insulation layer 52 and may cover and contact the fourth cell contact 64*a*. The fourth landing pad 68*a* may extend through the second insulation layer 54.

The third conductive structure 72*a* may be the same as or similar to the first conductive structure 72. The third conductive structure 72*a* may be disposed on and electrically connected to the third landing pad 66*a*. In addition, the fourth conductive structure 74*a* may be the same as or similar to the second conductive structure 74. The fourth conductive structure 74*a* may be disposed on and electrically connected to the fourth landing pad 68*a*.

In the embodiment illustrated in FIG. 1 and FIG. 2, the bit line structures (e.g., the first bit line structure 2, the second bit line structure 3, the third bit line structure 2*a* and the fourth bit line structure 3*a*) are buried or disposed in the base structure 10, thus, the bit line contacts between the bit line structures (e.g., the second bit line structure 3 and the fourth bit line structure 3*a*) and the active areas 103 (e.g., the third active area 13 and the sixth active area 13*a*) may be omitted. Further, the thickness of the cell contact (e.g., the first cell contact 62, the second cell contact 64, the third cell contact 62*a* and the fourth cell contact 64*a*) may be reduced. Therefore, an electrical path between the bit line structures (e.g., the second bit line structure 3 and the fourth bit line structure 3*a*) and the conductive structures (e.g., the first conductive structure 72, the second conductive structure 74, the third conductive structure 72*a* and the fourth conductive structure 74*a*) may be reduced. Thus, the electric resistance between the bit line structures and the conductive structures is lowered, and a signal margin is improved. The total height the semiconductor structure 1 is reduced.

Further, the bit line structures (e.g., the first bit line structure 2, the second bit line structure 3, the third bit line structure 2*a* and the fourth bit line structure 3*a*) are buried or disposed in the base structure 10, and the cell contacts (e.g., the first cell contact 62, the second cell contact 64, the third cell contact 62*a* and the fourth cell contact 64*a*) are disposed over base structure 10. That is, the cell contacts are not disposed next to the bit line structures side by side. The main portion (e.g., the main portion 21) of the first bit line structure 2 may be spaced apart from the cell contact (e.g., the first cell contact 62 and the second cell contact 64) by a portion (e.g., the lower portion 221) of a cap portion (e.g., the cap portion 22). The long distance between the main portion (e.g., the main portion 21) of the first bit line structure 2 and the cell contact (e.g., the first cell contact 62) can reduce the parasitic capacitance and can further improve the signal margin.

In addition, the width W6 of the contact area 55 may be greater than one half of the width W4 of the first active area 11. The large contact area 55 between the first cell contact 62 and the first active area 11 can further improve the signal margin.

Figure 3:
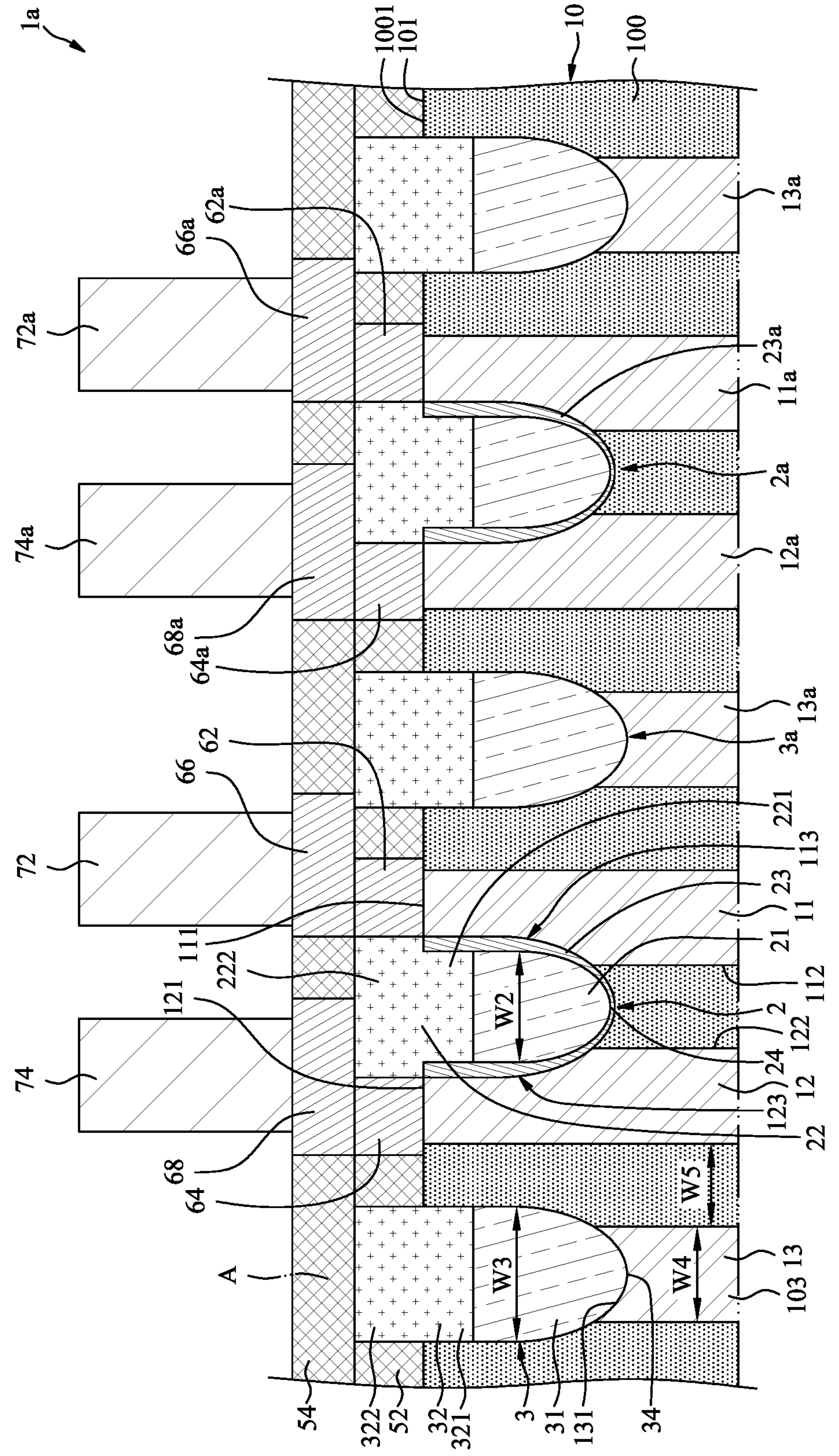
FIG. 3 illustrates a cross-sectional view of a semiconductor structure in accordance with some embodiments of the present disclosure.

FIG. 3 illustrates a cross-sectional view of a semiconductor structure 1*a* in accordance with some embodiments of the present disclosure. The semiconductor structure 1*a* of FIG. 3 is similar to the semiconductor structure 1 of FIG. 1, except that the width of the upper portion 222 of the cap portion 22 of the first bit line structure 2 of FIG. 3 may be greater the width of the upper portion 222 of the cap portion 22 of the first bit line structure 2 of FIG. 1. As shown in FIG. 3, the width of the upper portion 222 of the cap portion 22 of the first bit line structure 2 may be greater than the width of the lower portion 221 of the cap portion 22 of the first bit line structure 2. The upper portion 222 of the cap portion 22 may cover and contact the top surface 231 of the spacer 23. The first cell contact 62 may not cover and contact the top surface 231 of the spacer 23.

FIG. 4 through FIG. 17 illustrate a method of manufacturing a semiconductor structure 1 according to some embodiments of the present disclosure.

Figure 4:
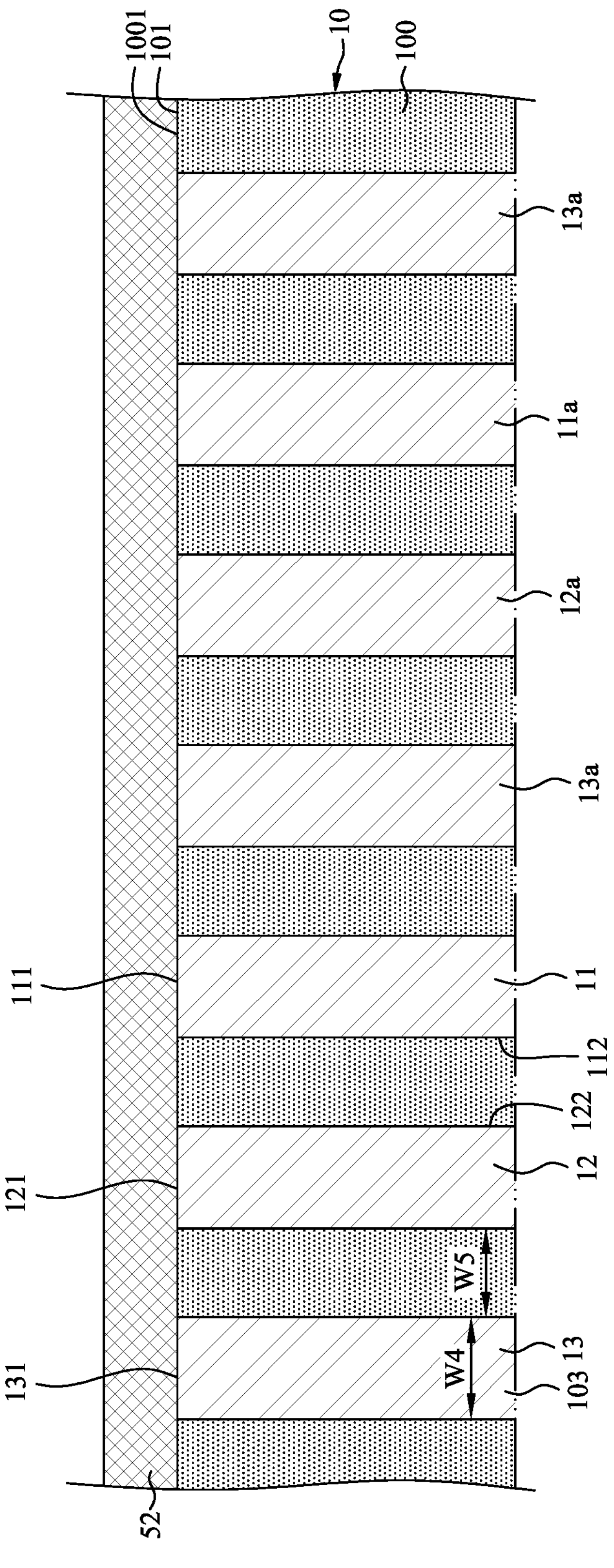
FIG. 4 illustrates a cross-sectional view of one or more stages of an example of a method of manufacturing a semiconductor structure according to some embodiments of the present disclosure.

Referring to FIG. 4, a base structure 10 and a first insulation layer 52 disposed thereon may be provided. The base structure 10 and the first insulation layer 52 of FIG. 4 may be same as or similar to the base structure 10 and the first insulation layer 52 of FIG. 1.

In some embodiments, the base structure 10 may include a base portion 100 and a plurality of active areas 103 (e.g., a first active area 11, a second active area 12, a third active area 13, a fourth active area 11*a*, a fifth active area 12*a* and a sixth active area 13*a*) disposed in or embedded in the base portion 100. The base portion 100 may have a top surface 1001 (e.g., a first surface).

The base structure 10 may have a top surface 101 (e.g., a first surface). In some embodiments, the first active area 11 may have a top surface 111 and a lateral surface 112. The top surface 111 of the first active area 11 may be aligned with or coplanar with the top surface 1001 of the base portion 100, and may be a portion of the top surface 101 of the base structure 10. The top surface 111 of the first active area 11 may be exposed from the top surface 101 of the base structure 10.

In some embodiments, the second active area 12 may have a top surface 121 and a lateral surface 122. The lateral surface 122 of the second active area 12 may face the lateral surface 112 of the first active area 11. The top surface 121 of the second active area 12 may be aligned with or coplanar with the top surface 1001 of the base portion 100, and may be a portion of the top surface 101 of the base structure 10. The top surface 121 of the second active area 12 may be exposed from the top surface 101 of the base structure 10.

In some embodiments, the third active area 13 may have a top surface 131. The top surfaces 111, 121, 131 of the active areas 103 (e.g., the first active area 11, the second active area 12 and the third active area 13) are aligned with each other. The first insulation layer 52 may be disposed on the top surface 101 of the base structure 10 to cover the active areas 103 (e.g., the first active area 11, the second active area 12 and the third active area 13).

Figure 5:
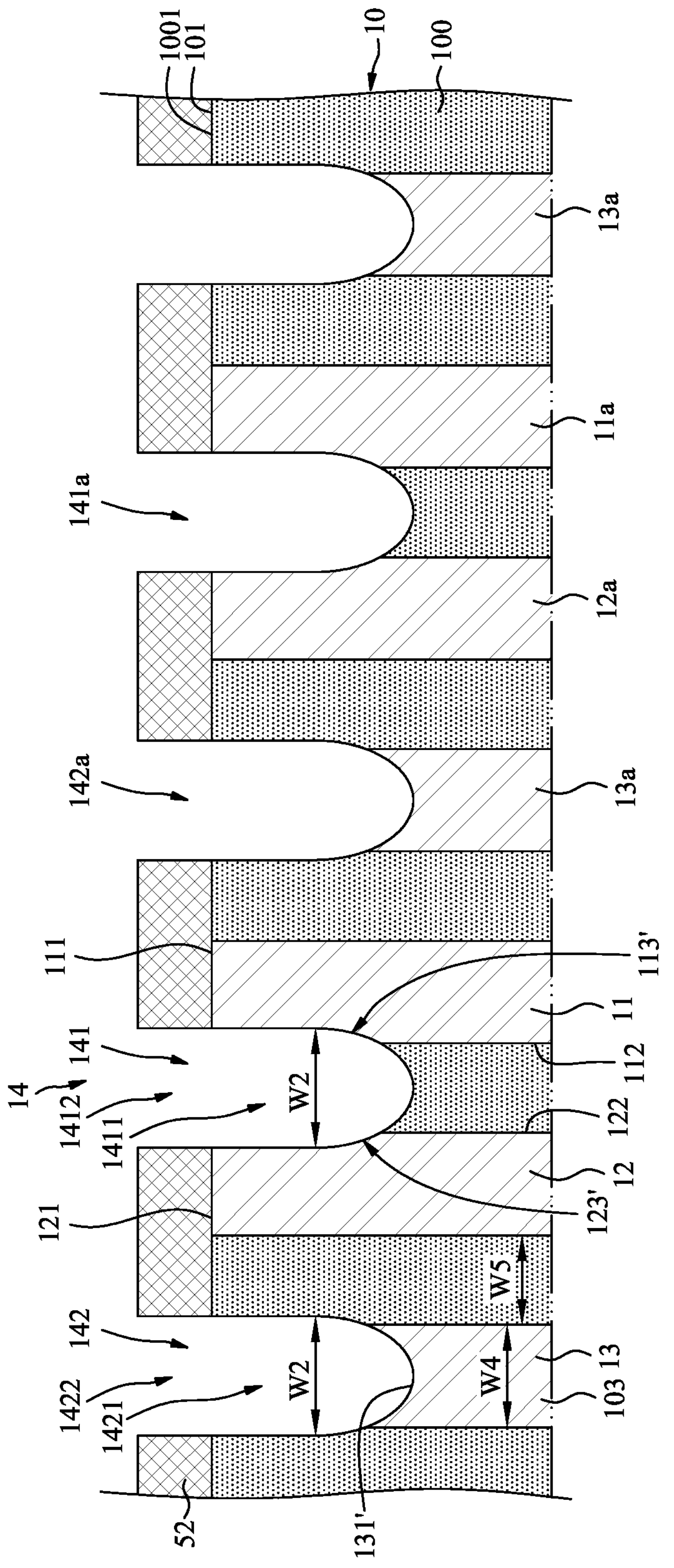
FIG. 5 illustrates a cross-sectional view of one or more stages of an example of a method of manufacturing a semiconductor structure according to some embodiments of the present disclosure.

Referring to FIG. 5, a plurality of trenches 14 may be formed to extend through the first insulation layer 52 and extend in the base portion 100 and the plurality of active areas 103. The dimension and shape of the trenches 14 may be substantially the same as each other. The trenches 14 may be formed by applying a photoresist layer and conducting an etching process.

The trenches 14 may include a first trench 141, a second trench 142, a third trench **141*a* and a fourth trench 142*a*. The first trench 141 may include a lower portion 1411 and an upper portion 1412. The lower portion 1411 is located in the base structure 10. The upper portion 1412 extends through the first insulation layer 52. The first trench 141 may have a maximum width W2. The first active area 11 may define an indentation 113' at a corner. The indentation 113' may be recessed from the top surface 111 of the first active area 11 and the lateral surface 112 of the first active area 11. The second active area 12 may define an indentation 123' at a corner. The indentation 123' may be recessed from the top surface 121 of the second active area 12 and the lateral surface 122 of the second active area 12. The indentation 113' and the indentation 123' may define portions of the lower portion 1411 of the first trench 141. Thus, the first trench 141 exposes portions of the first active area 11 and the second active area 12**.

The second trench 142 may include a lower portion 1421 and an upper portion 1422. The lower portion 1421 is located in the base structure 10. The upper portion 1422 extends through the first insulation layer 52. The second trench 142 may have a maximum width W2. The third active area 13 may have a top surface 131'. The top surface 131' may be concave, and may define a portion of the lower portion 1421 of the second trench 142. Thus, the second trench 142 exposes a portion of the third active area 13. The third trench **141*a* may be the same as the first trench 141. The fourth trench 142*a* may be the same as the second trench 142**.

Figure 6:
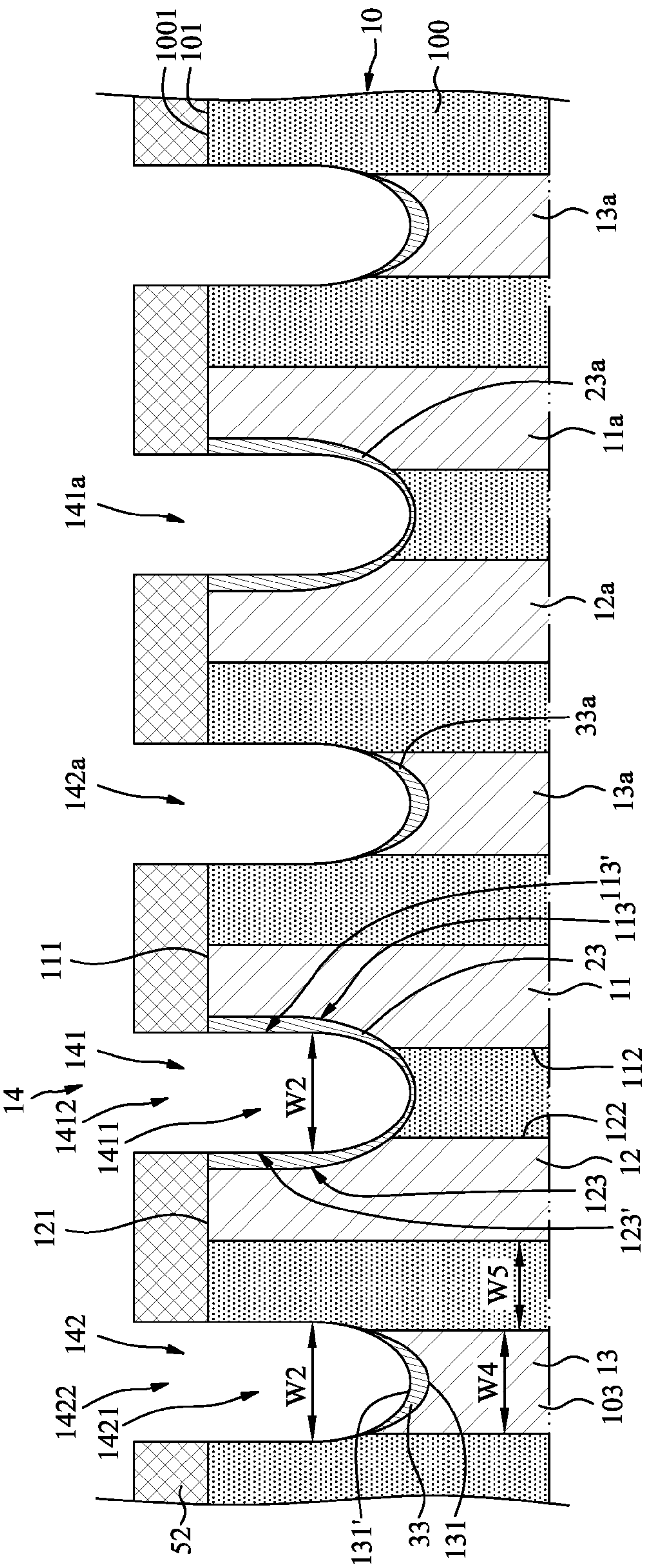
FIG. 6 illustrates a cross-sectional view of one or more stages of an example of a method of manufacturing a semiconductor structure according to some embodiments of the present disclosure.

Referring to FIG. 6, portions of the active areas 103 that are exposed in the trenches 14 may be oxidized so as to form a plurality of oxides on the active areas 103 that are exposed in the trenches 14. For example, a first oxide 23 (e.g., a spacer 23) may be formed on the indentation 113' of the first active area 11 and the indentation 123' of the second active area 12. Thus, an indentation 113 of the first active area 11 may be formed. The oxidation reaction may be carried out from the indentation 113' to the indentation 113. The shape of the indentation 113 may be similar to the shape of the indentation 113'. The indentation 113 may be an interface between the first oxide 23 and the first active area 11. A distance between the indentation 113' and the indentation 113 may be the thickness of the first oxide 23.

Meanwhile, an indentation 123 of the second active area 12 may be formed. The oxidation reaction may be carried out from the indentation 123' to the indentation 123. The shape of the indentation 123 may be similar to the shape of the indentation 123'. The indentation 123 may be an interface between the first oxide 23 and the second active area 12. A distance between the indentation 123' and the indentation 123 may be the thickness of the first oxide 23.

For example, a second oxide 33 may be formed on the top surface 131' of the third active area 13. Thus, a top surface 131 of the third active area 13 may be formed. The oxidation reaction may be carried out from the top surface 131' to the top surface 131. The shape of the top surface 131 may be similar to the shape of the top surface 131'. The top surface 131 may be an interface between the second oxide 33 and the third active area 13. A distance between the top surface 131' and the top surface 131 may be the thickness of the second oxide 33.

Figure 7:
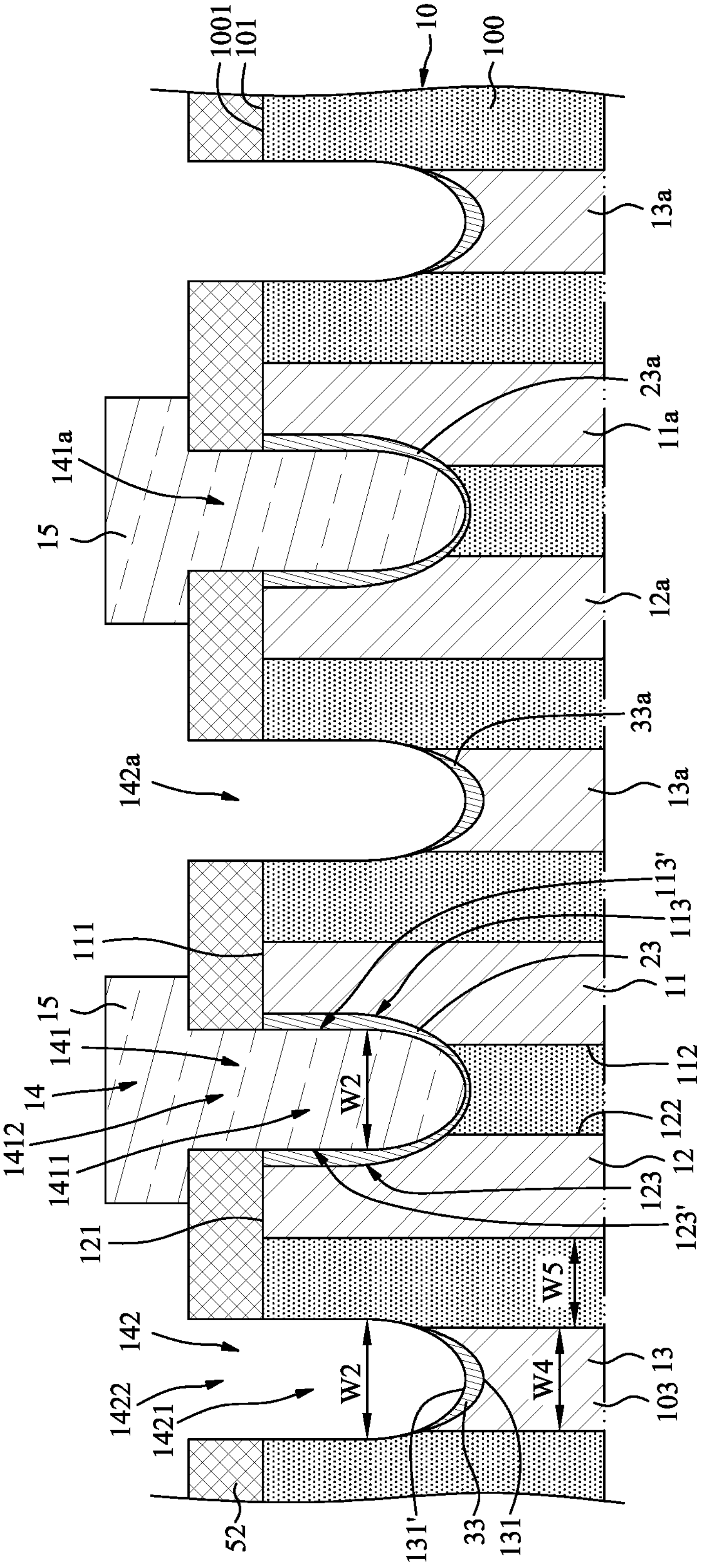
FIG. 7 illustrates a cross-sectional view of one or more stages of an example of a method of manufacturing a semiconductor structure according to some embodiments of the present disclosure.

Referring to FIG. 7, a photoresist layer 15 may be formed. The photoresist layer 15 may be formed to cover and fill the first trench 141 and the third trench **141*a* to protect the spacer 23 (e.g., the first oxide 23) and the spacer 23*a* during an etching process. The photoresist layer 15 may not cover the second trench 142 and the fourth trench 142*a*. That is, the second trench 142 and the fourth trench 142*a*** are exposed.

Figure 8:
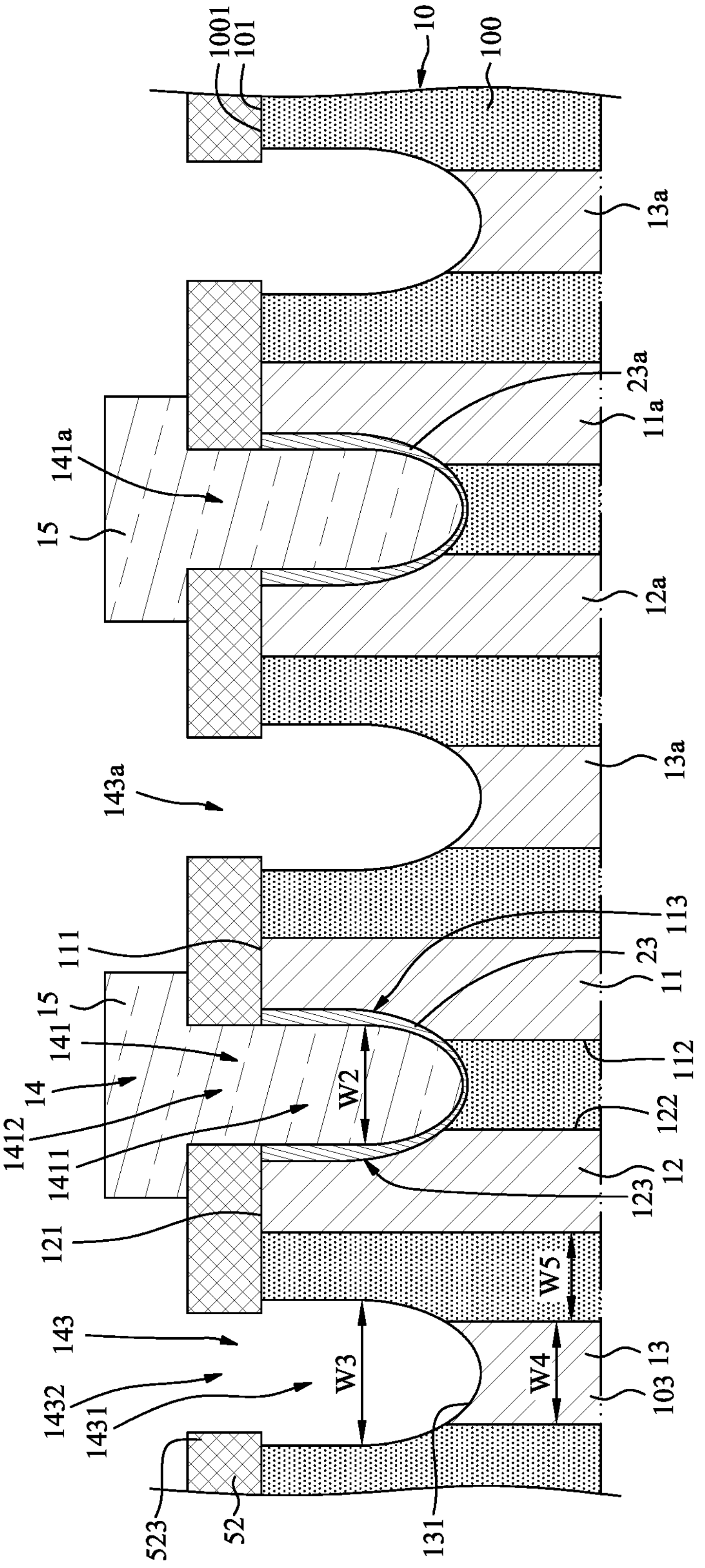
FIG. 8 illustrates a cross-sectional view of one or more stages of an example of a method of manufacturing a semiconductor structure according to some embodiments of the present disclosure.

Referring to FIG. 8, the second oxide 33 in the second trench 142 and the fourth trench **142*a* may be completely removed by, for example, etching process. Meanwhile, a portion of the base portion 100 may be also removed concurrently. However, the first insulation layer 52 may be not removed. Therefore, the second trench 142 and the fourth trench 142*a* become a second trench 143 and a fourth trench 143*a***.

The second trench 143 may include a lower portion 1431 and an upper portion 1432. The lower portion 1431 is located in the base structure 10. The upper portion 1432 extends through the first insulation layer 52. The lower portion 1431 may have a maximum width W3. That is, the lower portion 1431 is enlarged after the etching process. The width of the upper portion 1432 is equal to the width of the upper portion 1422. Thus, the first insulation layer 52 may include an overhanging portion 523 over the lower portion 1431. The lower portion of the fourth trench **143*a*** is also enlarged after the etching process.

Figure 9:
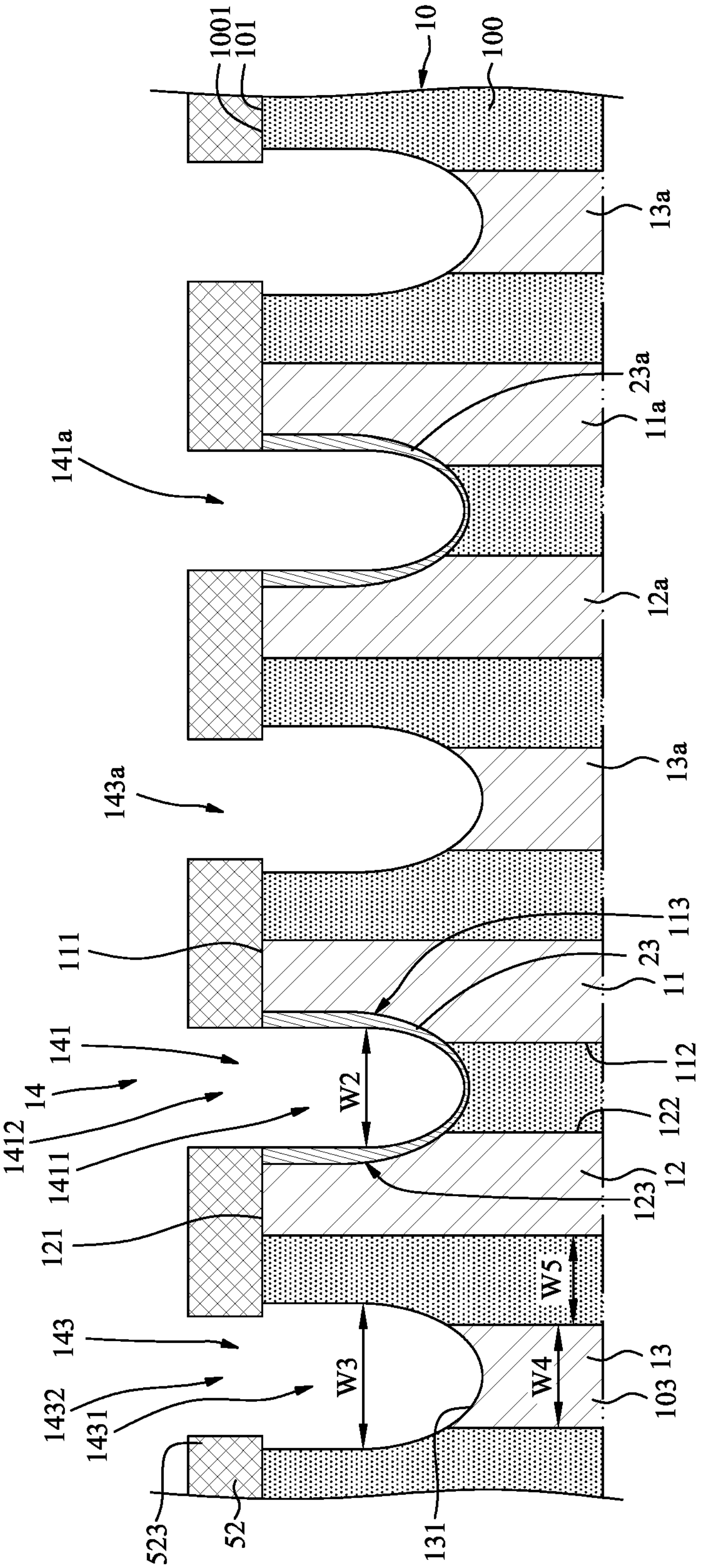
FIG. 9 illustrates a cross-sectional view of one or more stages of an example of a method of manufacturing a semiconductor structure according to some embodiments of the present disclosure.

Referring to FIG. 9, the photoresist layer 15 may be removed, so that the first trench 141 (with the spacer 23) and the third trench **141*a* (with the spacer 23*a***) are exposed.

Figure 10:
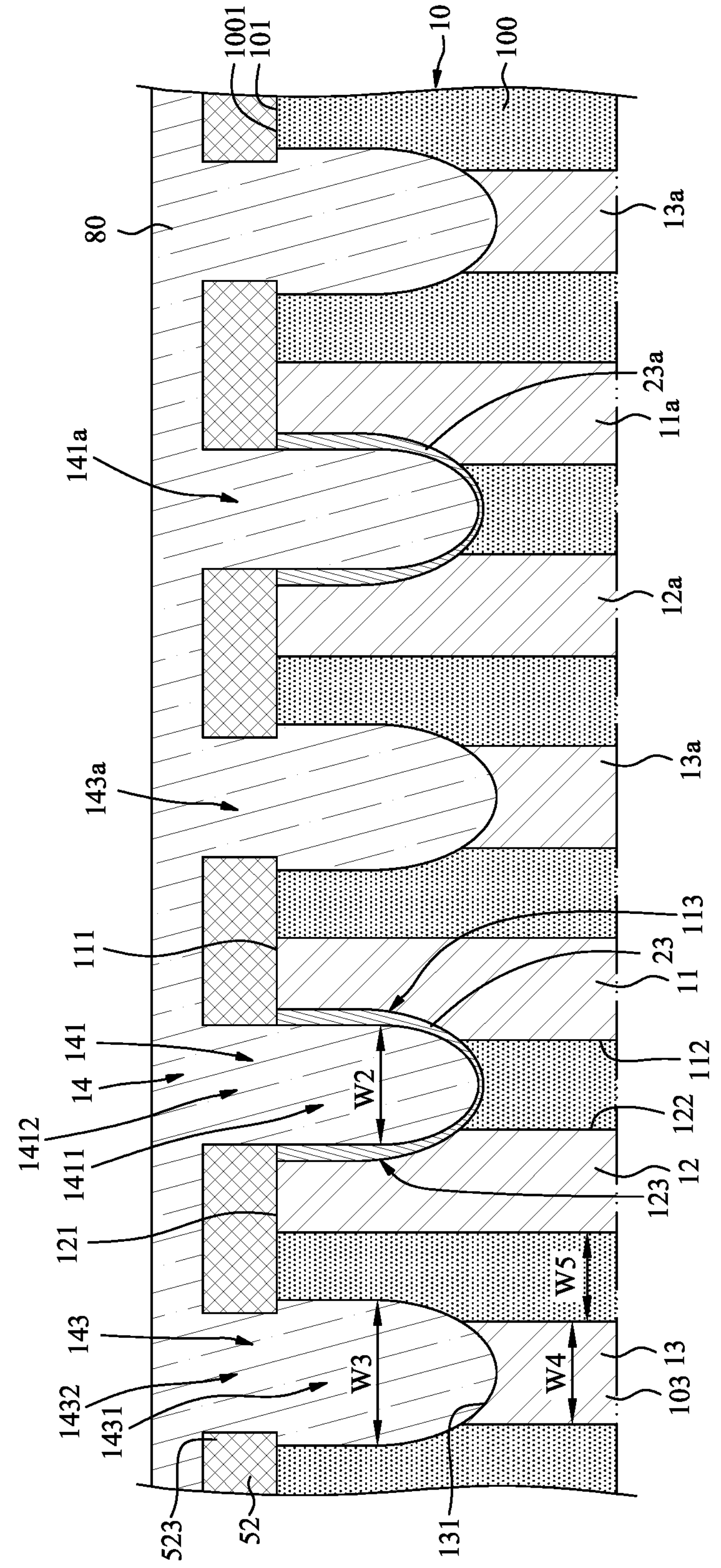
FIG. 10 illustrates a cross-sectional view of one or more stages of an example of a method of manufacturing a semiconductor structure according to some embodiments of the present disclosure.

Referring to FIG. 10, a conductive material 80 may be formed to fill the trenches 14 (e.g., the first trench 141, the second trench 143, the third trench **141*a* and the fourth trench 143*a*), and cover the top surface of the first insulation layer 52. A material of the conductive material 80** may include a metal such as tungsten (W).

Figure 11:
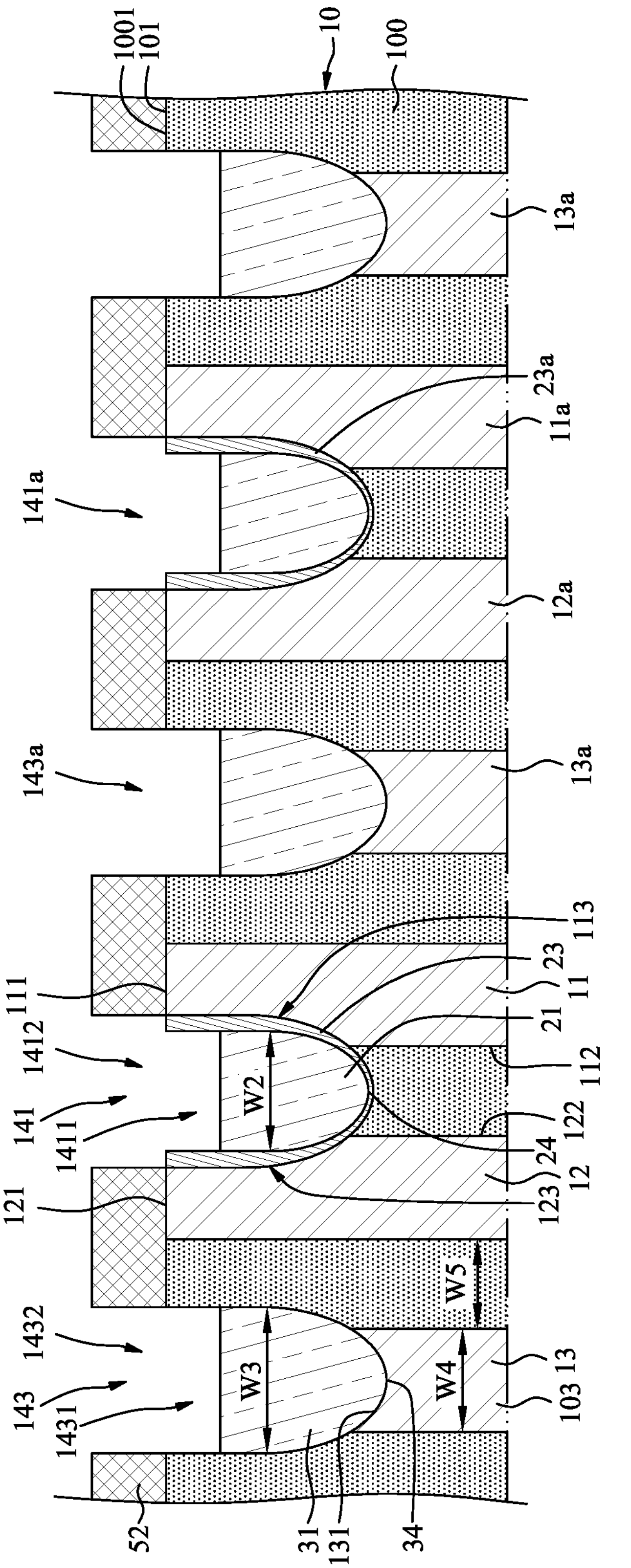
FIG. 11 illustrates a cross-sectional view of one or more stages of an example of a method of manufacturing a semiconductor structure according to some embodiments of the present disclosure.

Referring to FIG. 11, an upper portion of the conductive material 80 may be removed by, for example, an etching process. For example, a portion of the conductive material 80 may remain in the first trench 141 to become a main portion 21. Another portion of the conductive material 80 may remain in the second trench 143 to become a main portion 31. The top surface of the main portion 21 and the top surface of the main portion 31 may be lower than the top surface 101 of the base structure 10. In addition, the overhanging portion 523 (FIG. 10) of the first insulation layer 52 located over the lower portion 1431 of the second trench 143 may be removed concurrently during the etching process. Thus, the upper portion 1432 of the second trench 143 may be enlarged to have a maximum width W3.

In addition, a portion of the first insulation layer 52 located over the spacer 23 may be removed concurrently during the etching process. Thus, the upper portion 1412 of the first trench 141 may be enlarged to have a width greater than the maximum width W2. That is, the upper portion 1412 is enlarged after the etching process. The top surface 231 (FIG. 2) of the spacer 23 may be exposed. The upper portion of the third trench 141*a* is also enlarged after the etching process. The top surface of the spacer 23*a* may be exposed.

Figure 12:
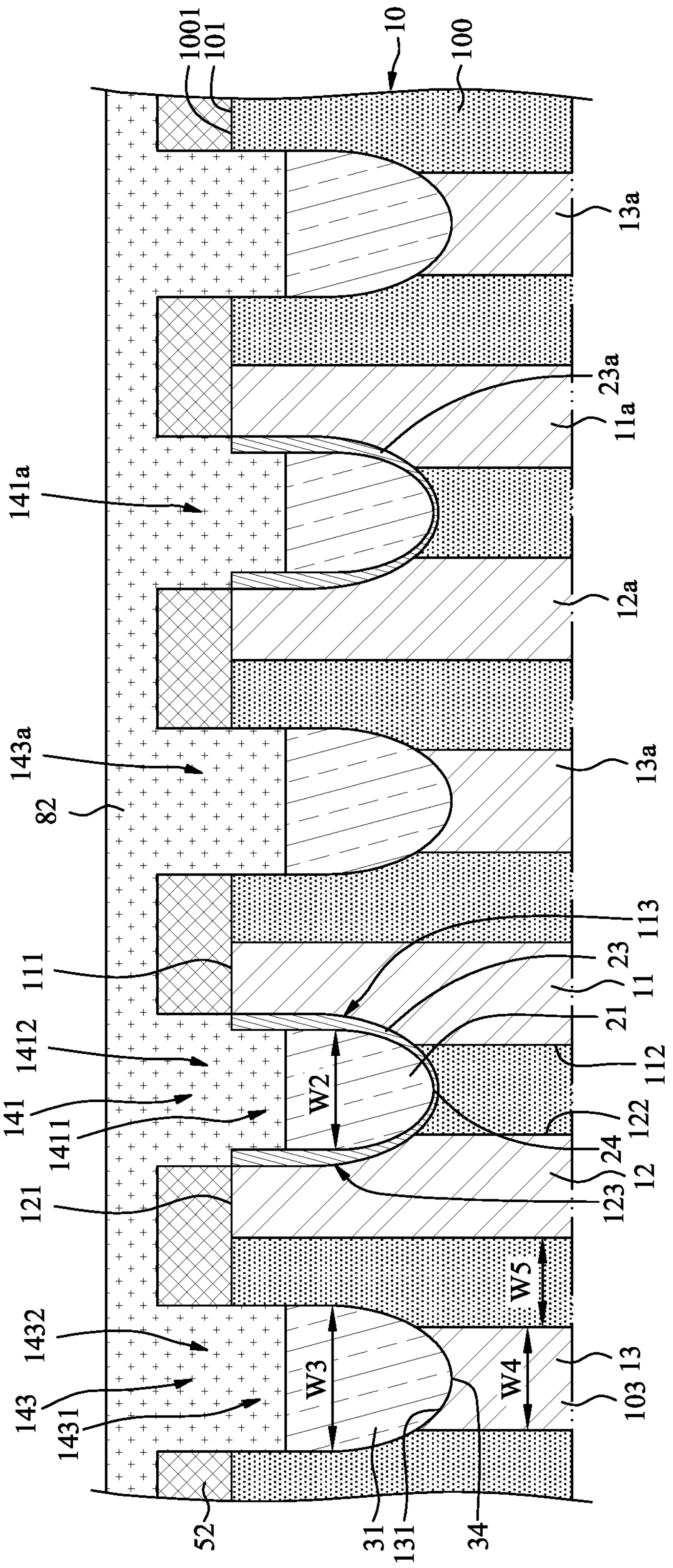
FIG. 12 illustrates a cross-sectional view of one or more stages of an example of a method of manufacturing a semiconductor structure according to some embodiments of the present disclosure.

Referring to FIG. 12, an insulation material 82 may be formed to fill the trenches 14 (e.g., the first trench 141, the second trench 142, the third trench 141*a* and the fourth trench 142*a*) so as to contact the main portions 21, 31, and cover the top surface of the first insulation layer 52. A material of the insulation material 82 may include silicon nitride (SiN). The material of the insulation material 82 may be the same as or different from the material of the first insulation layer 52.

Figure 13:
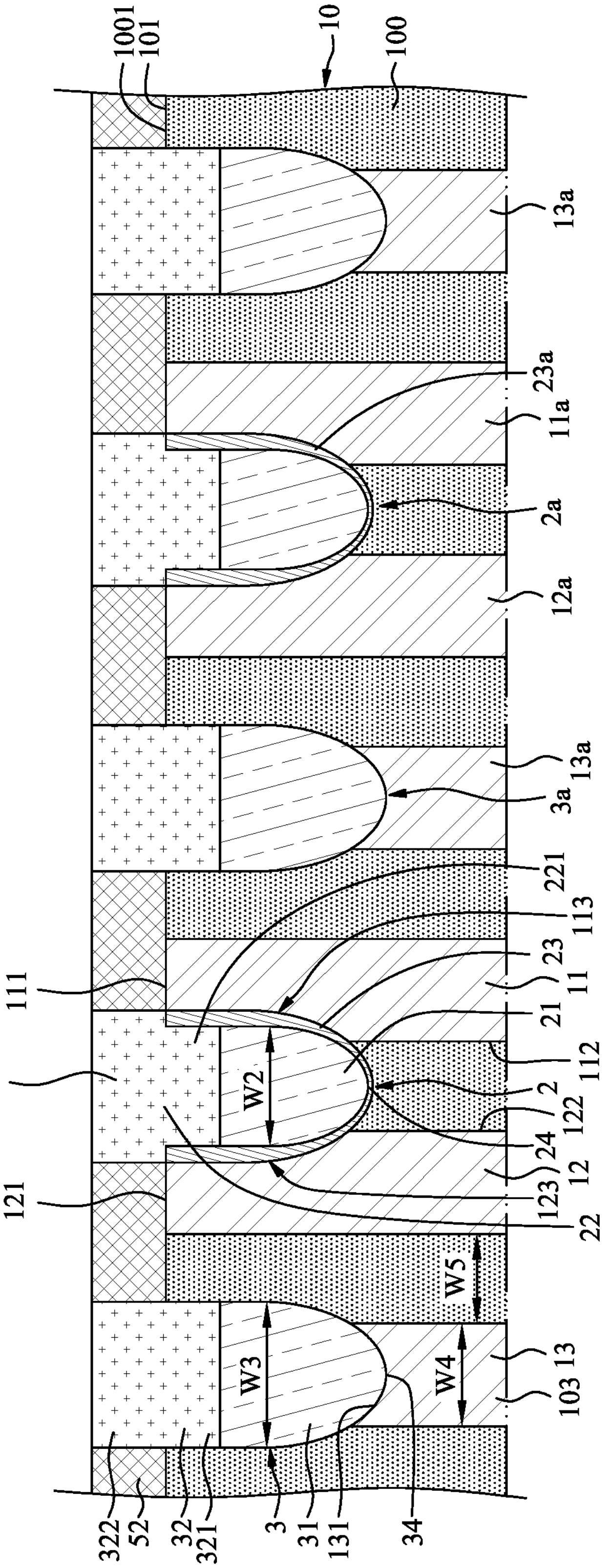
FIG. 13 illustrates a cross-sectional view of one or more stages of an example of a method of manufacturing a semiconductor structure according to some embodiments of the present disclosure.

Referring to FIG. 13, a grinding or polishing process (e.g., chemical-mechanical planarization (CMP)) may be performed on the top surface of the insulation material 82 to remove an upper portion of the insulation material 82 and expose the first insulation layer 52. For example, a portion of the insulation material 82 may remain in the first trench 41 to become a cap portion 22. Another portion of the insulation material 82 may remain in the second trench 42 to become a cap portion 32. Thus, the top surface of the first insulation layer 52 and the top surfaces of the cap portions 22, 32 may be coplanar with each other.

Meanwhile, a plurality of bit line structures (e.g., the first bit line structure 2, the second bit line structure 3, the third bit line structure 2*a* and the fourth bit line structure 3*a*) may be formed in the plurality of trenches 14 (e.g., the first trench 141, the second trench 143, the third trench 141*a* and the fourth trench 143*a*) respectively. The first bit line structure 2 and the third bit line structure 2*a* may be formed on the spacers 23, 23*a*.

The first bit line structure 2 may include the main portion 21 and the cap portion 22 disposed on the main portion 21. The cap portion 22 may include a lower portion 221 and an upper portion 222. The lower portion 221 is lower than the top surface 101 of the base structure 10. That is, the lower portion 221 is located under the top surface 101 of the base structure 10. The upper portion 222 is higher than the top surface 101 of the base structure 10. That is, the upper portion 222 may protrude beyond the top surface 101 of the base structure 10. The first bit line structure 2 may be disposed between the first active area 11 and the second active area 12, and may be electrically insulated with the first active area 11 and the second active area 12.

The second bit line structure 3 may include the main portion 31 and the cap portion 32 disposed on the main portion 31. The cap portion 32 may extend through the top surface 101 (e.g., the first surface) of the base structure 10. The cap portion 32 may include a lower portion 321 and an upper portion 322. The lower portion 321 is lower than the top surface 101 of the base structure 10. That is, the lower portion 321 is located under the top surface 101 of the base structure 10. The upper portion 322 is higher than the top surface 101 of the base structure 10. That is, the upper portion 322 may protrude beyond the top surface 101 of the base structure 10.

The second bit line structure 3 may be disposed over or disposed on the third active area 13, and may be electrically connected to the third active area 13. For example, the main portion 31 of the second bit line structure 3 may directly contact the top surface 131 of the third active area 13. The second bit line structure 3 may be free from being surrounded by a spacer. There is no spacer disposed between the second bit line structure 3 and the third active area 13 so that the second bit line structure 3 may be electrically connected to the third active area 13.

The maximum width W3 of the second bit line structure 3 may be greater than the width W4 of the third active area 13 and the width W5 of the portion of the base portion 100 that is disposed between the active areas 103. The maximum width W2 of the first bit line structure 2 is less than the maximum width W3 of the second bit line structure 3. In some embodiments, the bottom end 24 of the first bit line structure 2 may be not level with the bottom end 34 of the second bit line structure 3. For example, a level L1 (FIG. 2) of the bottom end 24 of the first bit line structure 2 may be higher than a level L2 (FIG. 2) of the bottom end 34 of the second bit line structure 3.

Figure 14:
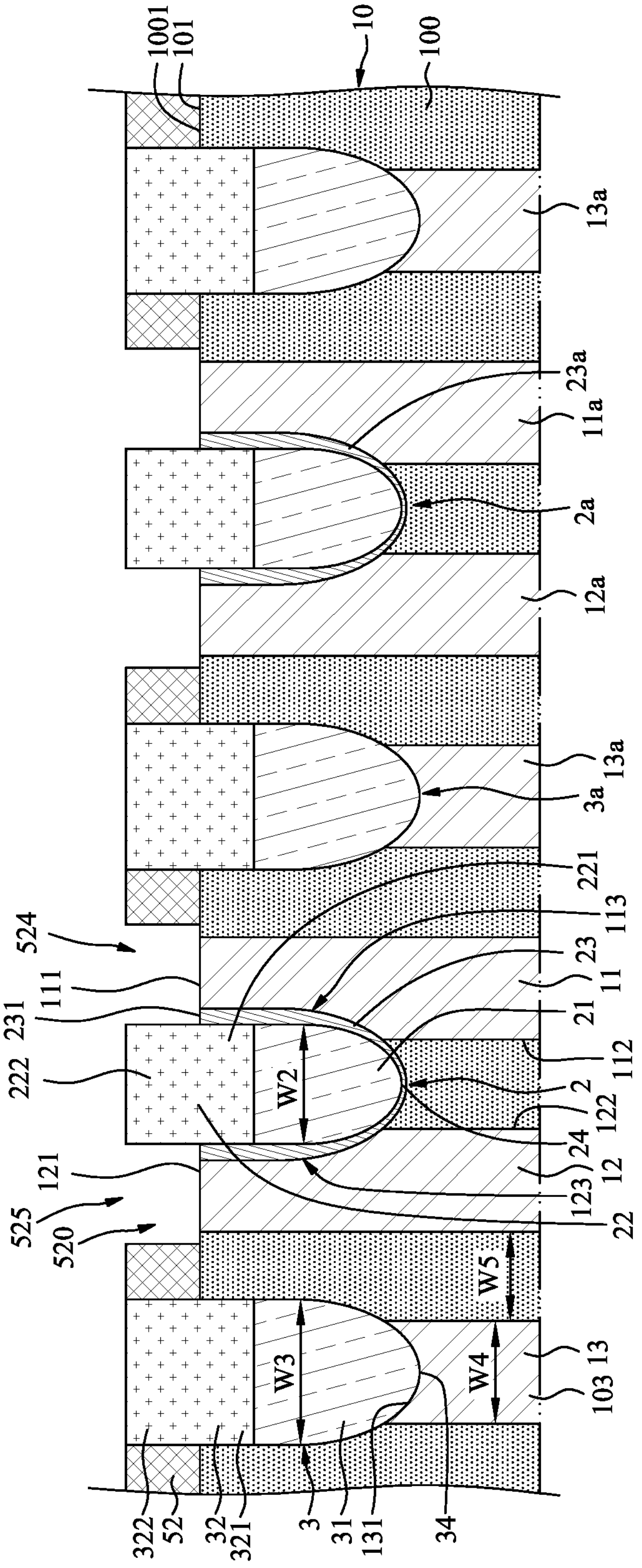
FIG. 14 illustrates a cross-sectional view of one or more stages of an example of a method of manufacturing a semiconductor structure according to some embodiments of the present disclosure.

Referring to FIG. 14, a plurality of openings 520 may be formed to extend through the first insulation layer 52 and expose the top surfaces of some of the active areas 103. In some embodiments, the openings 520 may include a first opening 524 and a second opening 525. The first opening 524 may expose the top surface 111 of the first active area 11 and the top surface 231 of the spacer 23. The second opening 525 may expose the top surface 121 of the second active area 12 and the top surface 231 of the spacer 23.

Figure 15:
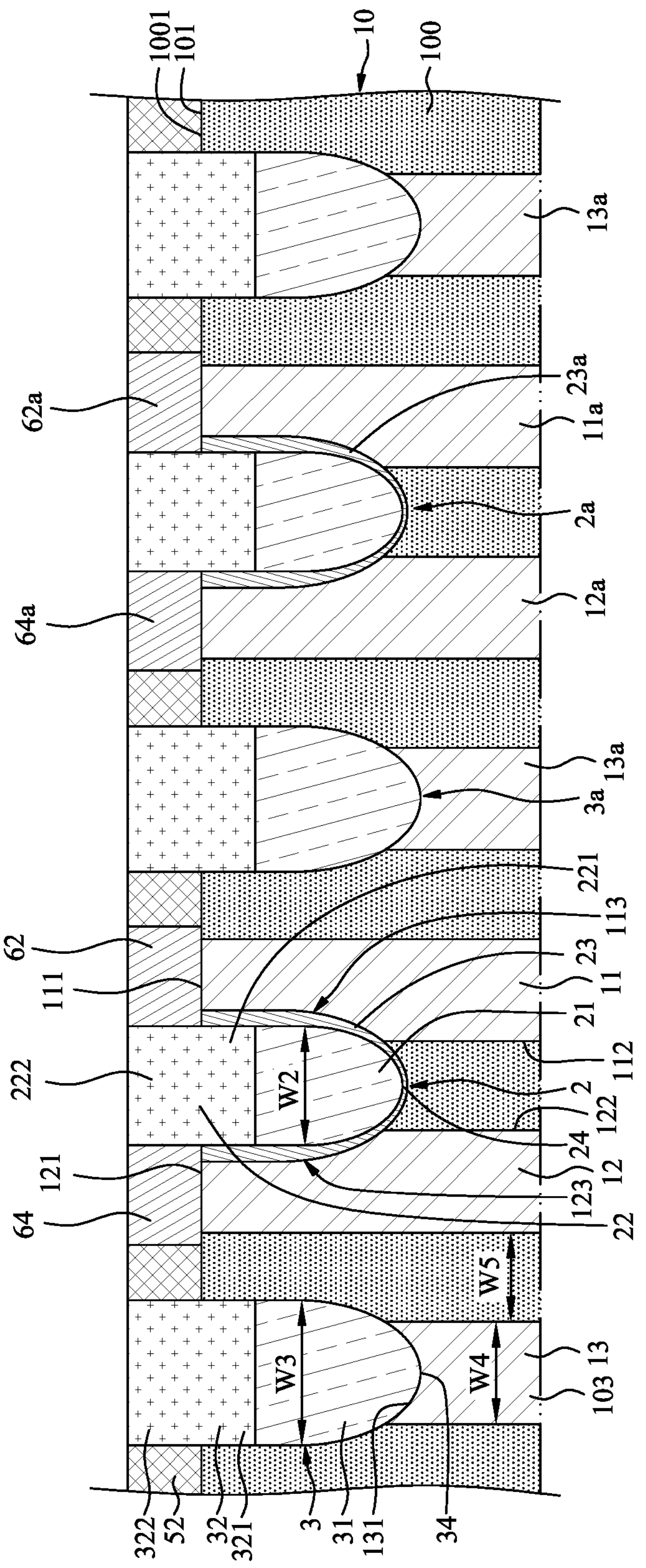
FIG. 15 illustrates a cross-sectional view of one or more stages of an example of a method of manufacturing a semiconductor structure according to some embodiments of the present disclosure.

Referring to FIG. 15, a conductive material may be formed or disposed in the openings 520 to form a plurality of cell contacts (e.g., a first cell contact 62, a second cell contact 64, a third cell contact 62*a* and a fourth cell contact 64*a*) on some of the plurality of active areas 103. The first cell contact 62 may cover and contact the first active area 11 and the top surface 231 of the spacer 23. The first cell contact 62 may extend through the first insulation layer 52. A lateral surface of the first cell contact 62 may contact a lateral surface of the upper portion 222 of the cap portion 22 of the first bit line structure 2.

The second cell contact 64 may cover and contact the second active area 12 and the top surface 231 of the spacer 23. The second cell contact 64 may extend through the first insulation layer 52. A lateral surface of the second cell contact 64 may contact a lateral surface of the upper portion 222 of the cap portion 22 of the first bit line structure 2.

The third cell contact 62*a* may be the same as or similar to the first cell contact 62. The third cell contact 62*a* may cover and contact the fourth active area 11*a*. The third cell contact 62*a* may extend through the first insulation layer 52. In addition, the fourth cell contact 64*a* may be the same as or similar to the second cell contact 64. The fourth cell contact 64*a* may cover and contact the fifth active area 12*a*. The fourth cell contact 64*a* may extend through the first insulation layer 52.

Figure 16:
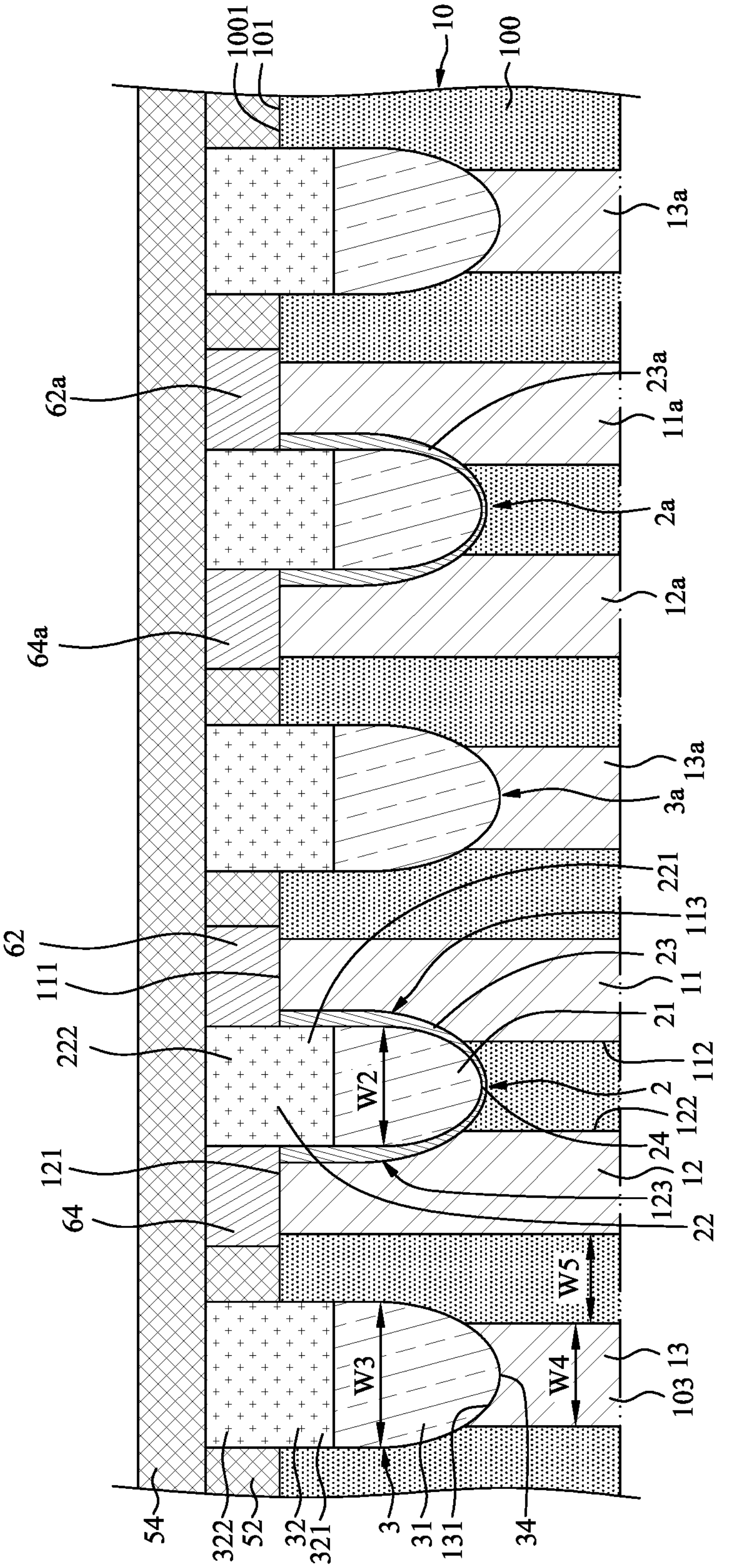
FIG. 16 illustrates a cross-sectional view of one or more stages of an example of a method of manufacturing a semiconductor structure according to some embodiments of the present disclosure.

Referring to FIG. 16, a second insulation layer 54 may be formed or disposed on the first insulation layer 52 to cover the cap portions 22, 32 and the cell contacts (e.g., the first cell contact 62, the second cell contact 64, the third cell contact 62*a* and the fourth cell contact 64*a*).

Figure 17:
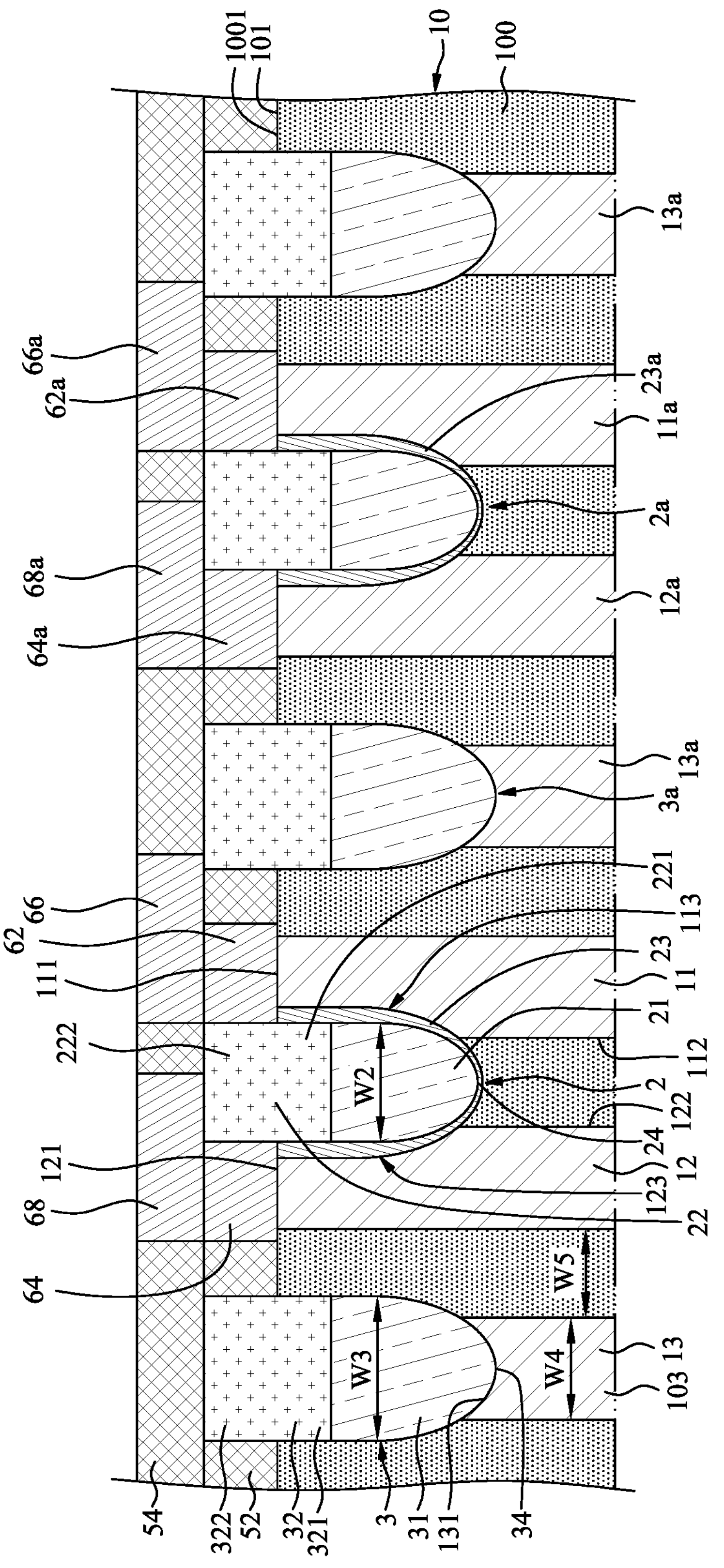
FIG. 17 illustrates a cross-sectional view of one or more stages of an example of a method of manufacturing a semiconductor structure according to some embodiments of the present disclosure.

Referring to FIG. 17, a plurality of landing pads (e.g., a first landing pad 66, a second landing pad 68, a third landing pad 66*a* and a fourth landing pad 68*a*) may be formed in the second insulation layer 54 to contact the cell contacts (e.g., the first cell contact 62, the second cell contact 64, the third cell contact 62*a* and the fourth cell contact 64*a*) respectively.

Then, a plurality of conductive structures (e.g., a first conductive structure 72, a second conductive structure 74, a third conductive structure 72*a* and a fourth conductive structure 74*a*) may be formed or disposed on the landing pads (e.g., the first landing pad 66, the second landing pad

68, the third landing pad 66*a* and the fourth landing pad 68*a*) so as to obtain the semiconductor structure 1 of FIG. 1 and FIG. 2.

Figure 18:
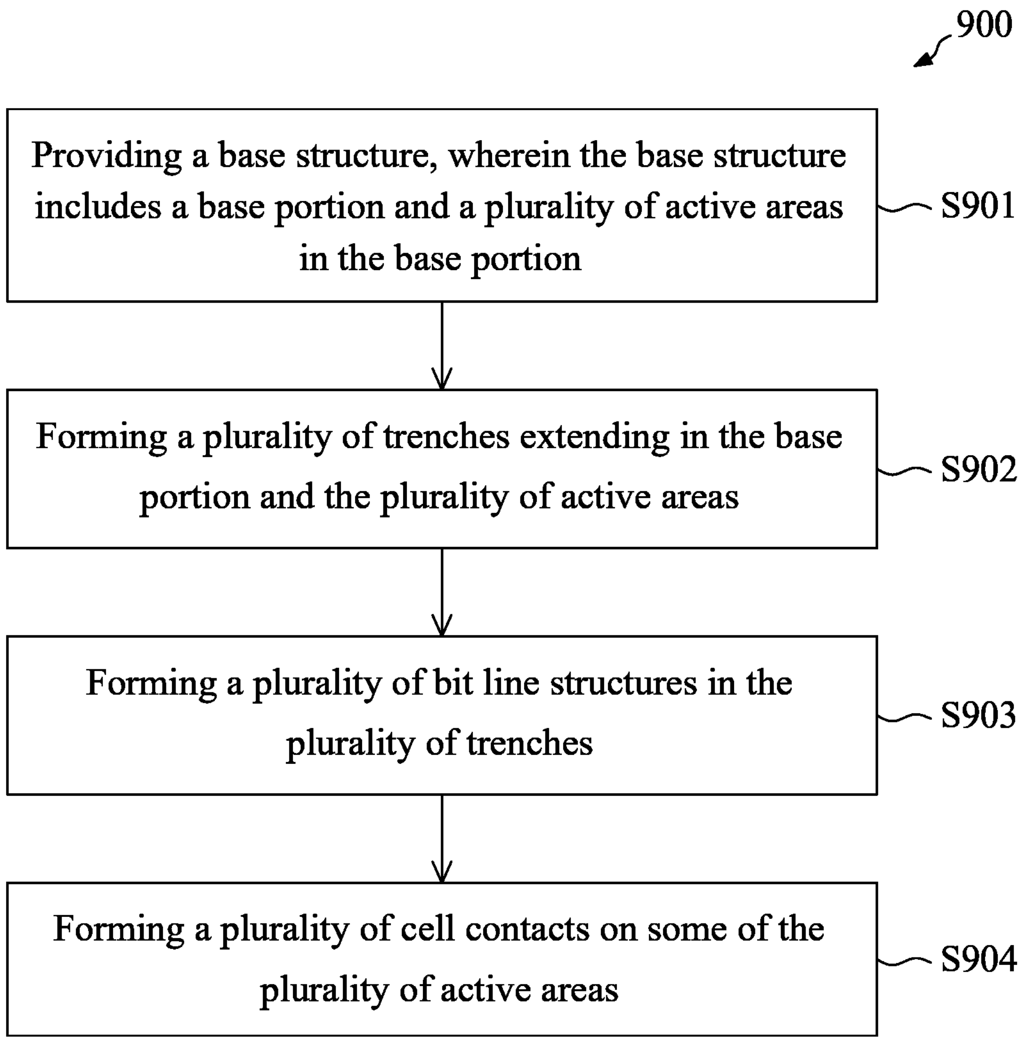
FIG. 18 illustrates a flow chart of a method of manufacturing a semiconductor structure according to some embodiments of the present disclosure.

FIG. 18 illustrates a flow chart of a method 900 of manufacturing a semiconductor structure according to some embodiments of the present disclosure.

In some embodiments, the method 900 can include a step S901, providing a base structure, wherein the base structure includes a base portion and at least one active area in the base portion. For example, as shown in FIG. 4, a base structure 10 is provided. The base structure 10 includes a base portion 100 and at least one active area 103, 11, 12, 13, 11*a*, 12*a*, 13*a* in the base portion 100.

In some embodiments, the method 900 can include a step S902, forming a plurality of trenches extending in the base portion and the plurality of active areas. For example, as shown in FIG. 5, the trenches 14 may be formed to extend in the base portion 100 and the active areas 103, 11, 12, 13, 11*a*, 12*a*, 13*a*.

In some embodiments, the method 900 can include a step S903, forming a plurality of bit line structures in the plurality of trenches. For example, as shown in FIG. 13, the bit line structures 2, 3, 2*a*, 3*a* may be formed in the trenches 14.

In some embodiments, the method 900 can include a step S904, forming a plurality of cell contacts on some of the plurality of active areas. For example, as shown in FIG. 15, the cell contacts 62, 64, 62*a*, 64*a* may be formed on the first active area 11, the second active area 12, the fourth active area 11*a* and the fifth active area 12*a*.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:

a base structure including a base portion and a first active area in the base portion;

a cell contact disposed over the base structure and electrically connected to the first active area; and a bit line structure disposed in the base portion and under the cell contact, wherein the bit line structure is electrically insulated from the first active area;

wherein the bit line structure comprises:

a main portion disposed under a top surface of the base structure;

a cap portion formed on the main portion and extended through the top surface of the base structure; and a spacer disposed around the main portion and below the top surface of the base structure, wherein the spacer is made of insulation material to electrically insulate the bit line structure from the first active area.

2. The semiconductor structure of claim 1, wherein the cell contact contacts the first active area.

3. The semiconductor structure of claim 1, wherein a width of a contact area between the cell contact and the first active area is greater than one half of a width of the first active area.

4. The semiconductor structure of claim 1, wherein the cap portion of the bit line structure has a lower portion extended below the top surface of the base structure and an upper portion extended above the top surface of the base structure.

5. The semiconductor structure of claim 4, wherein the main portion of the bit line structure is spaced apart from the cell contact by the lower portion of the cap portion, wherein the lower portion of the cap portion is extended to the main portion.

6. The semiconductor structure of claim 4, wherein a thickness of the cell contact is substantially equal to a thickness of the upper portion of the cap portion, wherein the thickness of the cell contact is defined as a distance between the top surface of the base structure and a top surface of the cell contact, wherein the thickness of the upper portion of the cap portion is defined as a distance between the top surface of the base structure and a top surface of the upper portion.

7. The semiconductor structure of claim 4, wherein the cell contact contacts the upper portion of the cap portion.

8. The semiconductor structure of claim 4, wherein the cap portion is a monolithic structure.

9. The semiconductor structure of claim 1, wherein the main portion of the bit line structure has a curved bottom surface to define a bottom end that a width of the main portion of the bit line structure is gradually reduced toward the bottom end.

10. The semiconductor structure of claim 9, wherein the spacer has an inconsistent thickness that a thickness of the spacer is gradually reduced toward the bottom end of the main portion of the bit line structure.

11. The semiconductor structure of claim 9, wherein the spacer tapers toward the bottom end of the main portion of the bit line structure.

12. The semiconductor structure of claim 9, wherein the cell contact contacts a top surface of the spacer, wherein a top surface of the spacer is coplanar with the top surface of the base structure.

13. The semiconductor structure of claim 1, wherein the base structure further includes a second active area in the base portion, wherein the bit line structure is disposed between the first active area and the second active area.

14. The semiconductor structure of claim 13, wherein the bit line structure extends beyond a lateral surface of the first active area and a lateral surface of the second active area.

15. The semiconductor structure of claim 1, wherein the first active area defines an indentation recessed from a top surface of the first active area and a lateral surface of the first active area.

16. The semiconductor structure of claim 15, wherein the bit line structure is disposed in the indentation.

* * * * *